(12) United States Patent
Buheis et al.

(10) Patent No.: US 7,292,046 B2
(45) Date of Patent: Nov. 6, 2007

(54) SIMULATED MODULE LOAD

(75) Inventors: Omar H. Buheis, Durham, NC (US); Robin K. Mitra, Apex, NC (US)

(73) Assignee: Infineon Technologies AG, Munich (DE)

( * ) Notice: Subject to any disclaimer, the term of this patent is extended or adjusted under 35 U.S.C. 154(b) by 328 days.

(21) Appl. No.: 10/654,342

(22) Filed: Sep. 3, 2003

(65) Prior Publication Data

US 2005/0046426 A1  Mar. 3, 2005

(51) Int. Cl.
G01R 31/02 (2006.01)
G11C 29/00 (2006.01)

(52) U.S. Cl. .................. 324/537; 714/718; 324/755
(58) Field of Classification Search ............... 324/537, 324/754, 755, 765, 763; 714/718, 724, 742
See application file for complete search history.

(56) References Cited

U.S. PATENT DOCUMENTS

| | | | | |
|---|---|---|---|---|
| 3,867,672 A * | 2/1975 | Pizzigoni | ................... | 361/774 |
| 5,548,526 A | 8/1996 | Misheloff | ................... | 703/15 |
| 5,844,419 A * | 12/1998 | Akram et al. | ................ | 324/755 |
| 6,008,664 A | 12/1999 | Jett et al. | .................... | 324/765 |
| 6,262,580 B1 * | 7/2001 | Wu | .............................. | 324/713 |
| 6,269,280 B1 | 7/2001 | Miyanishi et al. | .......... | 700/121 |
| 6,297,989 B1 | 10/2001 | Cloud et al. | ............. | 365/185.08 |
| 6,351,827 B1 * | 2/2002 | Co et al. | ....................... | 714/42 |
| 6,396,292 B2 * | 5/2002 | Hembree et al. | ........... | 324/755 |
| 6,441,633 B1 * | 8/2002 | Manhaeve et al. | .......... | 324/763 |
| 6,442,718 B1 * | 8/2002 | Tran et al. | ................... | 714/721 |
| 6,529,426 B1 | 3/2003 | Merritt et al. | ............... | 365/201 |
| 6,617,180 B1 | 9/2003 | Wang | .......................... | 438/618 |
| 6,643,164 B2 | 11/2003 | Laurent | ....................... | 365/149 |
| 6,734,744 B2 * | 5/2004 | Monzel et al. | ................. | 331/57 |
| 6,956,387 B2 * | 10/2005 | Ho et al. | ..................... | 324/755 |
| 7,154,288 B2 * | 12/2006 | Kakizawa et al. | ........... | 324/763 |
| 2001/0033181 A1 * | 10/2001 | Kim et al. | .................... | 324/765 |
| 2001/0034865 A1 * | 10/2001 | Park et al. | ................... | 714/724 |
| 2003/0177424 A1 | 9/2003 | Ninomiya et al. | ........... | 714/718 |
| 2004/0042139 A1 * | 3/2004 | Belverde et al. | ............. | 361/100 |
| 2004/0196025 A1 * | 10/2004 | Casey et al. | .............. | 324/158.1 |
| 2005/0086037 A1 * | 4/2005 | Pauley et al. | .................. | 703/14 |

FOREIGN PATENT DOCUMENTS

| | | |
|---|---|---|
| EP | 0630502 B1 | 11/1995 |
| EP | 0543408 B1 | 10/1998 |
| EP | 1225588 A2 | 7/2002 |
| WO | WO93/18468 | 9/1993 |
| WO | WO95/26533 | 10/1995 |

* cited by examiner

*Primary Examiner*—Anjan Deb
(74) *Attorney, Agent, or Firm*—Brinks Hofer Gilson & Lione (57) ABSTRACT

A circuit and method of operation for simulating a capacitive load for an integrated circuit or chip. The circuit adds a small capacitor to a test cell that tests the performance of a chip, such as a DRAM memory device, so that it may be tested realistically before being soldered into a final assembly, such as a DRAM module. Other passive devices, such as inductors or resistors may also be used in place of or in addition to a capacitor. By providing increased capacitance, or inductance or resistance for the test sequence, each circuit is tested under more realistic conditions. In one example, DRAM memory device modules may be realistically tested for performance by using sockets with small capacitors hard wired between pins of the DRAM device and a test interface used to perform the tests.

20 Claims, 8 Drawing Sheets

SIMULATED MODULE LOAD

FIELD OF THE INVENTION

The present invention relates generally to the field of dynamic random access memories (DRAMS), and more particularly the present invention relates to testing of DRAMS.

BACKGROUND OF THE INVENTION

Dynamic random access memories (DRAMS) are used extensively in electronic circuits, especially in circuits requiring great amounts of memory in a very rapid computing environment. The personal computer is likely the greatest market for these circuits, but other markets also exist, from telecommunications, to Internet and electronic-commerce applications, to graphics and publishing. Whatever the application, users and manufacturers constantly seek to improve both computers and their memories, looking for improvements in everything from software to hardware to better interactions between the two.

One area for improvement is increasing reliability in manufacturing. An important goal is to catch errors and stop production as soon as possible after a manufacturing error is made. If DRAMS are manufactured with faults, then not only are the parts and DRAMS lost, but all the time, effort and investment that went into processing those parts are also lost. Such mistakes may be caught by in-process checks. In-process checks are not an ideal solution, because such checks tend to catch mistakes after they are made, rather than preventing mistakes or improving the process that made the mistakes. However, in-process checks may be necessary for certain types of manufacturing, especially if the processes are not amenable to reliability improvements. Assemblies may benefit from in-process checks if the individual parts from which the assemblies are made cannot be reliably checked individually.

This will be particularly true for defects of such a nature that they do not completely prevent a portion of a memory device from functioning, but rather slow the device down. Thus, a defect which breaks a path in a word line or a bit line, an open in the circuit, can be detected because it will disable a portion of the device, at least that word line or bit line. Defects may also occur that will slow down the memory device, such as a thin portion in the polysilicon or the cladding layer typically formed above the polysilicon. Such a defect will not disable the particular word line or bit line in which it occurs, but may slow down the device or portion of the device by a few nanoseconds. Such a slowing may or may not be evident on a less-than-100% functional check given DRAMS in production testing, but may become evident when the DRAM is put into service.

Checking every bit in a memory device will not detect this sort of defect, nor will functional tests, such as a "butterfly" test, in which a single bit is written to and the surrounding bits are also written to. The single bit is then checked, and the device or the memory is assessed. By repeating this test in several ways, i.e., vertically, horizontally, and diagonally, defects or subsets of problems within devices may be detected. There are other tests and patterns that may be used, but these tests tend to detect relatively direct problems, rather than more subtle problems that only manifest themselves when a particular type of program or particular portion of the memory or the device is used.

DRAMS may be considered as assemblies of many parts, and in particular, they may be thought of as assemblies of the individual DRAM memory devices or modules. When the devices are assembled, the address lines for the devices may be a single address line connected to all the devices. This may also apply to command lines. By lines are meant the traces or circuits on the silicon by which signals are sent from one location to another.

The test environment for a single device is very different from the test environment for a number of devices assembled into a DRAM module. Tests, especially functional and timing tests for the addresses on the devices, may yield significantly different results from tests of individual devices. This difference may be caused by the much smaller capacitance of an address line or a command line connected to one device as compared to the capacitance of an address line or a command line connected to a multitude of devices.

What is needed is a way to make a test environment as realistic as possible for an individual memory device as for the assembled DRAM module. What is needed is a way to simulate in testing the conditions and capacitance seen by an individual DRAM memory device as it would be in an assembled DRAM module.

BRIEF SUMMARY

The present invention meets this need by providing an apparatus and a method for in-process checks for DRAM memory devices before they are assembled into a DRAM module. One aspect of the invention is a test circuit for testing an integrated circuit. The test circuit comprises a computer, a test fixture comprising a test interface and at least one socket board with a plurality of sockets, and a passive component connected between at least one socket and the computer.

Another aspect of the invention is a test circuit for testing an integrated circuit. The test circuit comprises a computer, a test fixture comprising a test interface and at least one socket fixture with a plurality of sockets, and also comprises a capacitor connected between at least one socket and the computer, wherein the capacitor is from about 30 nF to about 200 nF.

Another aspect of the invention is a test circuit for testing a dynamic random access memory device. The test circuit comprises a computer and a test fixture comprising a test interface and at least one socket fixture with a plurality of sockets. The test circuit also comprises a capacitor connected in series between at least one socket and the computer, wherein the capacitor is from about 30 nF to about 200 nF.

Another aspect of the invention is a method of testing an integrated circuit before permanent installation in another circuit. The method comprises providing a test computer and a test interface further including at least one bread board with a plurality of sockets for receiving pins from an integrated circuit, and connecting a capacitor of between about 30 nF to about 200 nF in series between at least one socket and the computer. The method then includes testing the integrated circuit.

Another aspect of the invention is a method for testing an integrated circuit. The method comprises providing a test computer and a test interface including at least one socket board with a plurality of sockets for receiving pins from an integrated circuit. The method also includes connecting a passive component in series between at least one socket and the computer, and then testing the integrated circuit.

Many other embodiments and aspects of the invention are also possible. There are many ways to practice the present invention, as shown in the following drawings and specification. The embodiments are not meant to limit the invention, but rather to describe and illustrate the many ways that the present invention may be used.

DETAILED DESCRIPTION OF THE PRESENTLY PREFERRED EMBODIMENTS

Figure 1:
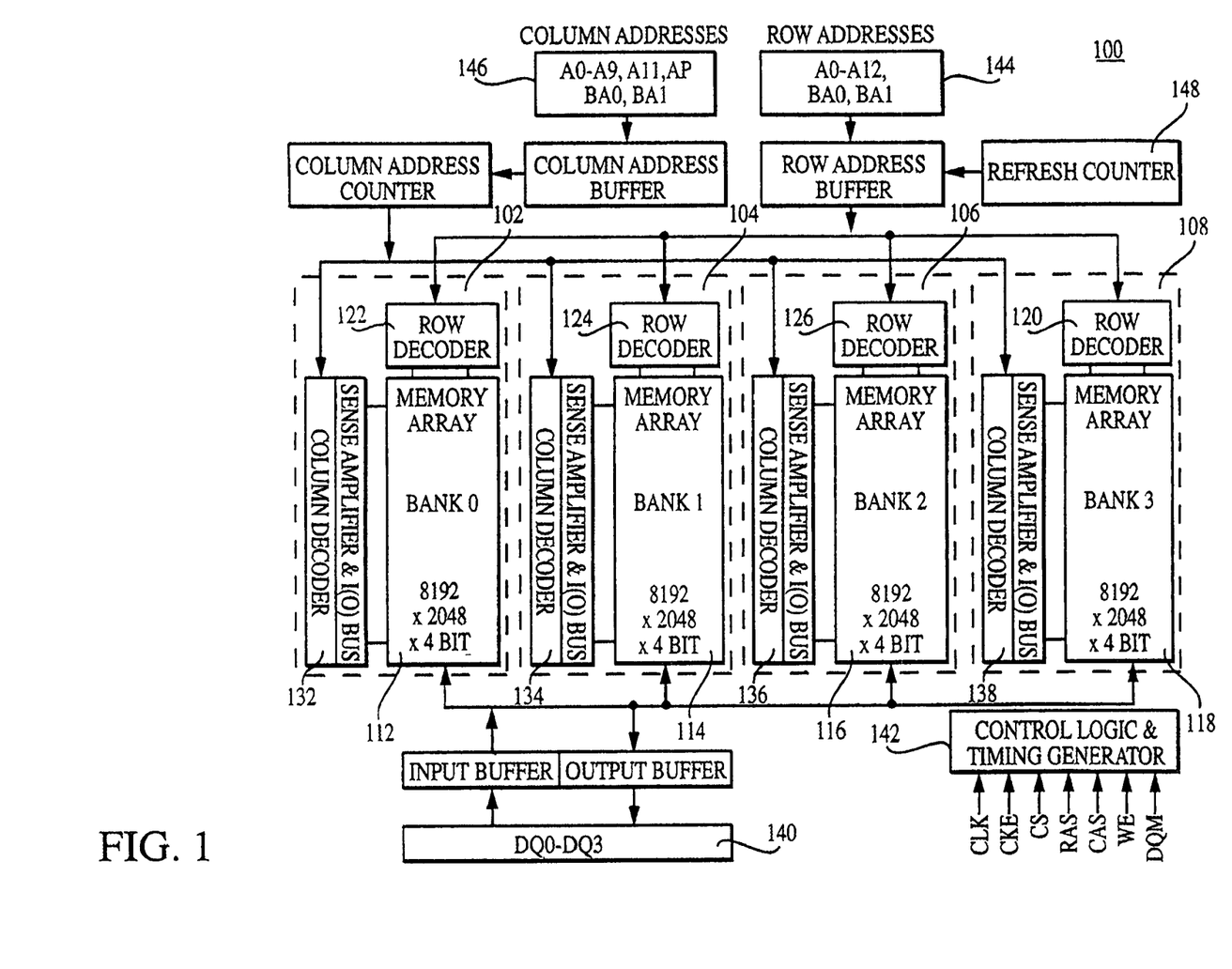
FIG. 1 is a block diagram of a dynamic random access memory.

FIG. 1 depicts a CMOS dynamic random access memory (DRAM) 100. This memory device is a 64 Megabit×4 synchronous DRAM, having four memory bank arrays 102, 104, 106 and 108. Each bank is capable of storing 8192× 2048×4 bits of memory. Each bank has a memory array 112, 114, 116 and 118, as well as a row decoder 120, 122, 124 and 126, and a column decoder 132, 134, 136, 138. Also included within the DRAM are input/output circuits 140, control logic and timing 142, row address circuitry 144, and column address circuitry 146. There may also be a refresh counter 148 for the constant refreshing necessary for DRAM circuits. By DRAM is meant both single data rate (SDR) and double data rate (DDR) devices. There are 8192 rows and 2048 columns in each memory device shown in FIG. 1. Therefore, each row has 2048 transistors and each column has 8192 transistors, each in series. Thus, in the word line (row), the numeral N would equal 2048, and each row would have 2048 transistors in series, one for each column. In this example, there are 4 bits per memory bank; other embodiments could have 8 bits or 16 bits per bank.

Figure 2:
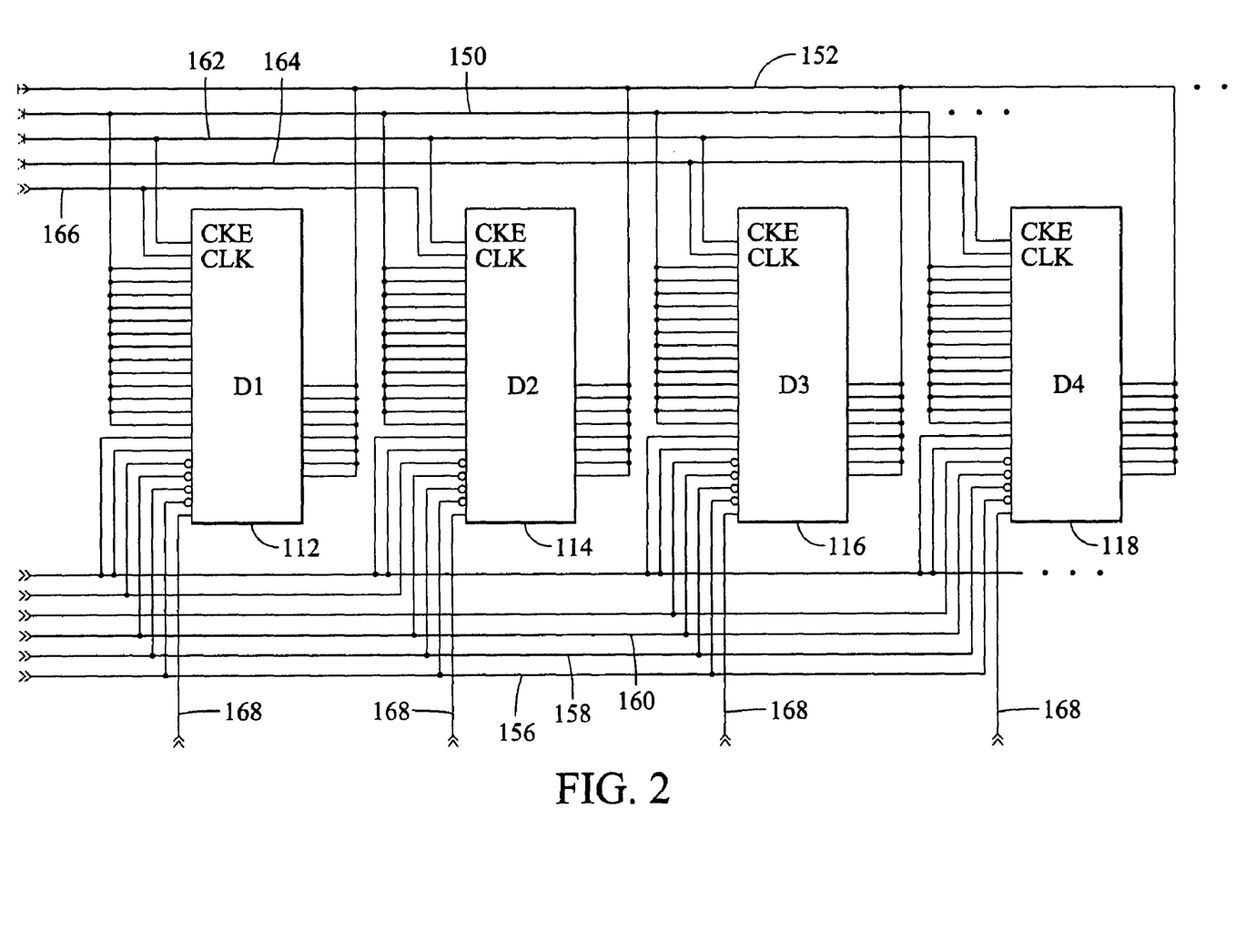
FIG. 2 is a schematic view of the number of parallel paths for different signal types in a DRAM module.

FIG. 2 depicts a closer view of the connections in a typical DRAM module layout having a plurality of devices or chips, 112, 114, 116, 118. There are a great many connections required between each memory device or chip 112, 114 and the facilities of the DRAM module, such as row decoders 120, 122, 124, 126, the column decoders 132, 134, 136, 138, input/output lines 140, control logic and timing generator 142, row addresses 144, column addresses 146, and so forth. As shown in FIG. 2, the address line 150, such as a row address line or a column address line, connects to the four devices shown, and may also connect to as many as 14 other chips or devices, if the particular DRAM module of which it is a part has 14 other devices. In this embodiment, address line 150 connects to thirteen addresses on each chip. Output line 152 connects to each chip or device, with eight output lines on each chip.

Other signal lines, such as the write enable line 156, column address strobe line 158 and row address strobe line 160 may connect to as many as eighteen chips, but may have only a single connection per chip. These lines are under the control of the DRAM's control logic and timing generator 142. Other signals, such as Clock Enable 162, may be split into several signals, each of the several signals routed to only 4 or 5 devices as shown. Yet other signals, as is the clock signal, here shown as lines 164, 166, are each routed to only 2 chips or devices in FIG. 2 and possibly to 2 or 3 additional devices not shown in the figure. Data input mask lines 168 each connect solely to a single device. Together, FIGS. 1 and 2 illustrate the many types of signals and the fact that some signals are routed to only specific locations while others may require a signal be routed to many locations at once.

Figure 3:
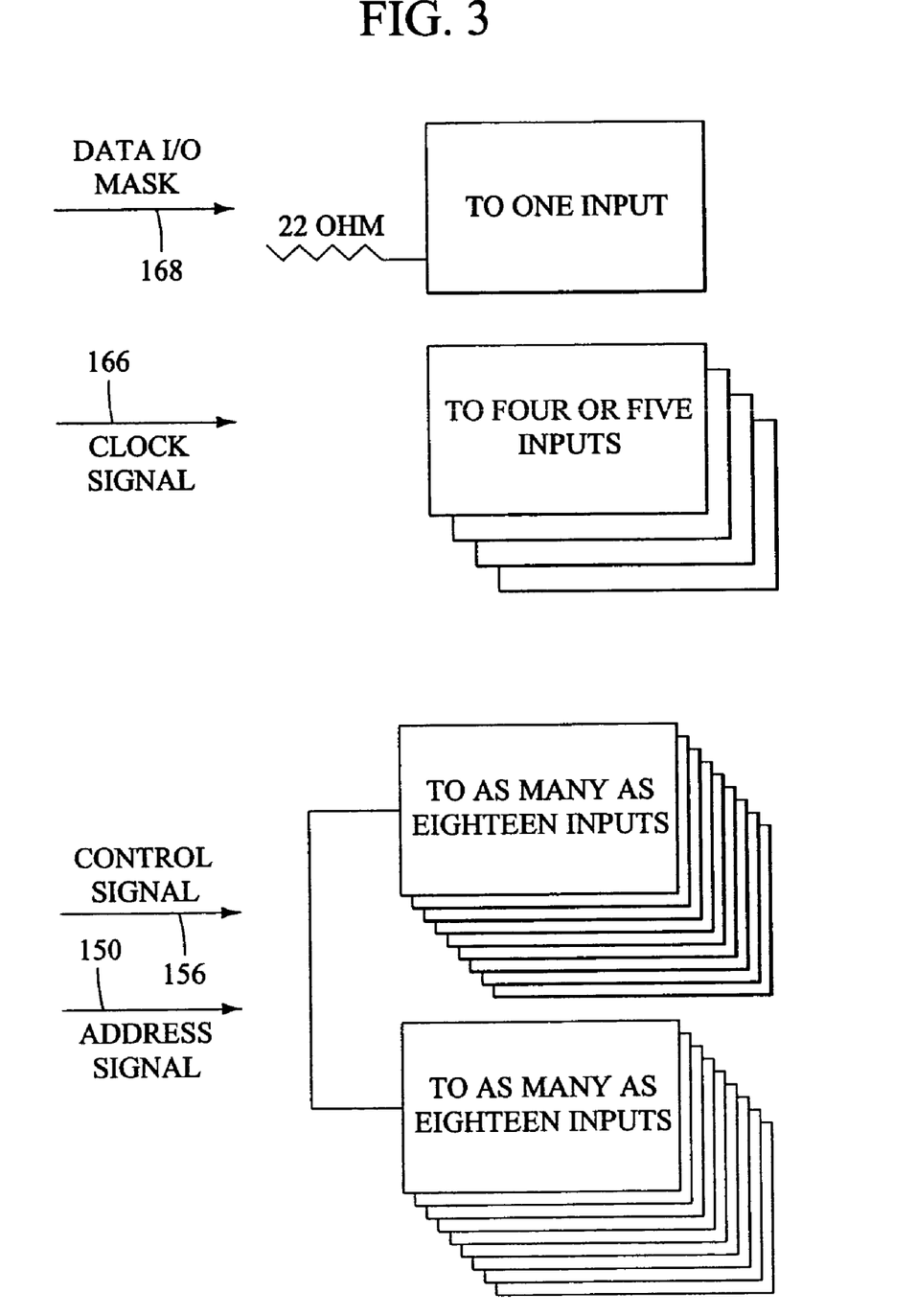
FIG. 3 is a schematic view of the different types and numbers of paths in a DRAM module.

FIG. 3 is another schematic view of the routing of signals. While data I/O mask lines 168 are addressed to a single memory location, timing or clock signals 166 are routed to four or five inputs in some models of DRAMS. Control and address signal lines 150, 156 may be connected to each chip or device in the DRAM module. There may be as many as eighteen parallel paths for command and address signals in each chip 112.

A data input/output signal, addressed to or from a unique or particular device, will be routed to or from only one location. If there are four parallel clock-select signals to serve eighteen memory devices, then each clock-select signal will be routed to four or five devices in parallel. Thus, there is potential for four or five times as much capacitance per clock-select signal circuit as with a data I/O signal. Finally, each command or address signal may be routed to as many as eighteen chips in certain types of DRAM memory modules. This could give rise to a capacitance as high as about eighteen times the capacitance of a single circuit, or even more if the busses are wide and inclusive. These capacitances may contribute to an undesired slowing of the operation of the memory. Testing of the individual devices is thus performed in an environment that does not represent a "real world" DRAM situation.

Figure 4:
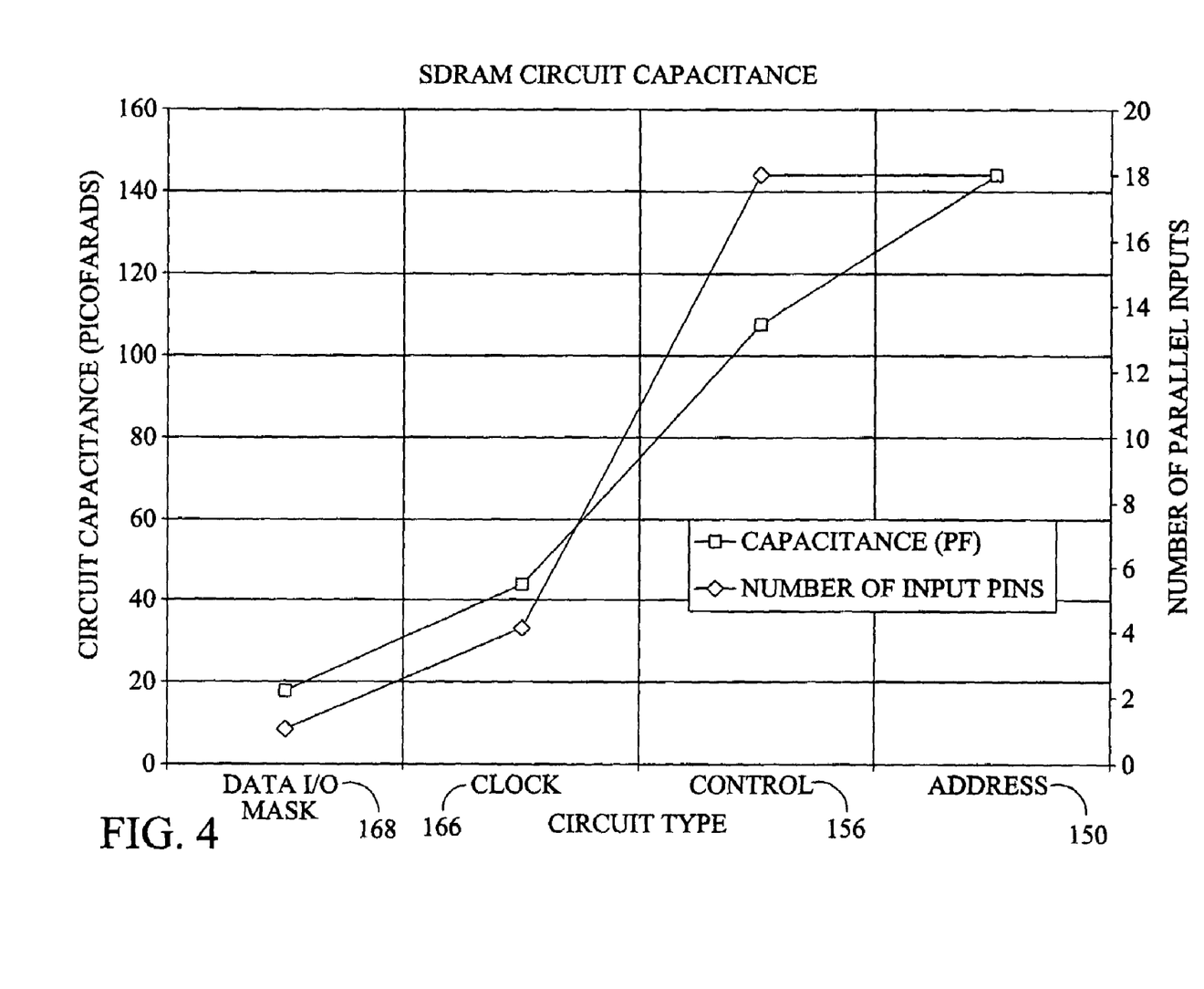
FIG. 4 is a graph of performance of different paths in a DRAM.
Figure 5:
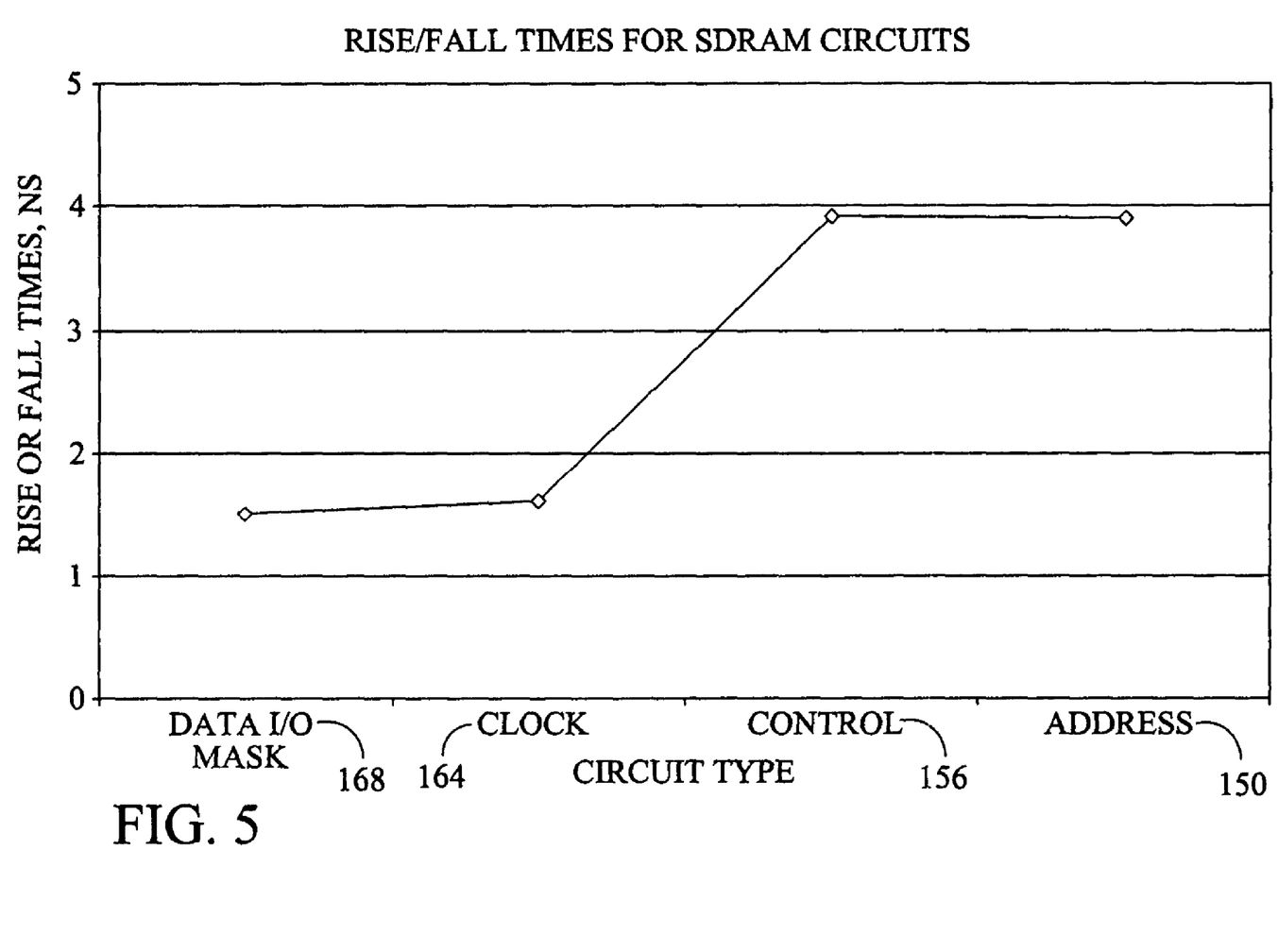
FIG. 5 is another graph of performance of paths in a DRAM.

FIG. 4 depicts capacitance differences in these circuits. Tests were conducted on circuits with different capacitances, including single-input data I/O mask lines 168, clock lines having 4 or 5 inputs 166, control lines 156 and address lines 150. The capacitance varied with the number of connections, as shown in the graph. There is a positive correlation between the number of parallel connections and the circuit capacitance. FIG. 5 depicts the results of tests for the different kinds of signal lines as applied to measurements of rise and fall times for a signal in each type of circuit. Rise and fall times correlate directly with the speed of the circuit. As the graph depicts, control and address lines have rise and fall times on the order of 4 or 5 nanoseconds, compared with 1 or 2 nanoseconds for the data and clock signals.

These performance differences occur when a memory device or chip is integrated into a DRAM module, with relatively long distances between each device and the command and address controls of the DRAM. As a result of these performance differences, it is very difficult to test the components or memory devices of DRAM modules or other large circuits in a realistic manner before they are assembled into a final end-product, such as a DRAM module, or even a large memory device. One solution is to add an appropriate capacitance to the circuits in which the memory devices or other large circuits are tested. A capacitor may be added in a direct way by taking advantage of the sockets that are typically used when circuits are tested before being soldered into a higher assembly or circuit.

Figure 6:
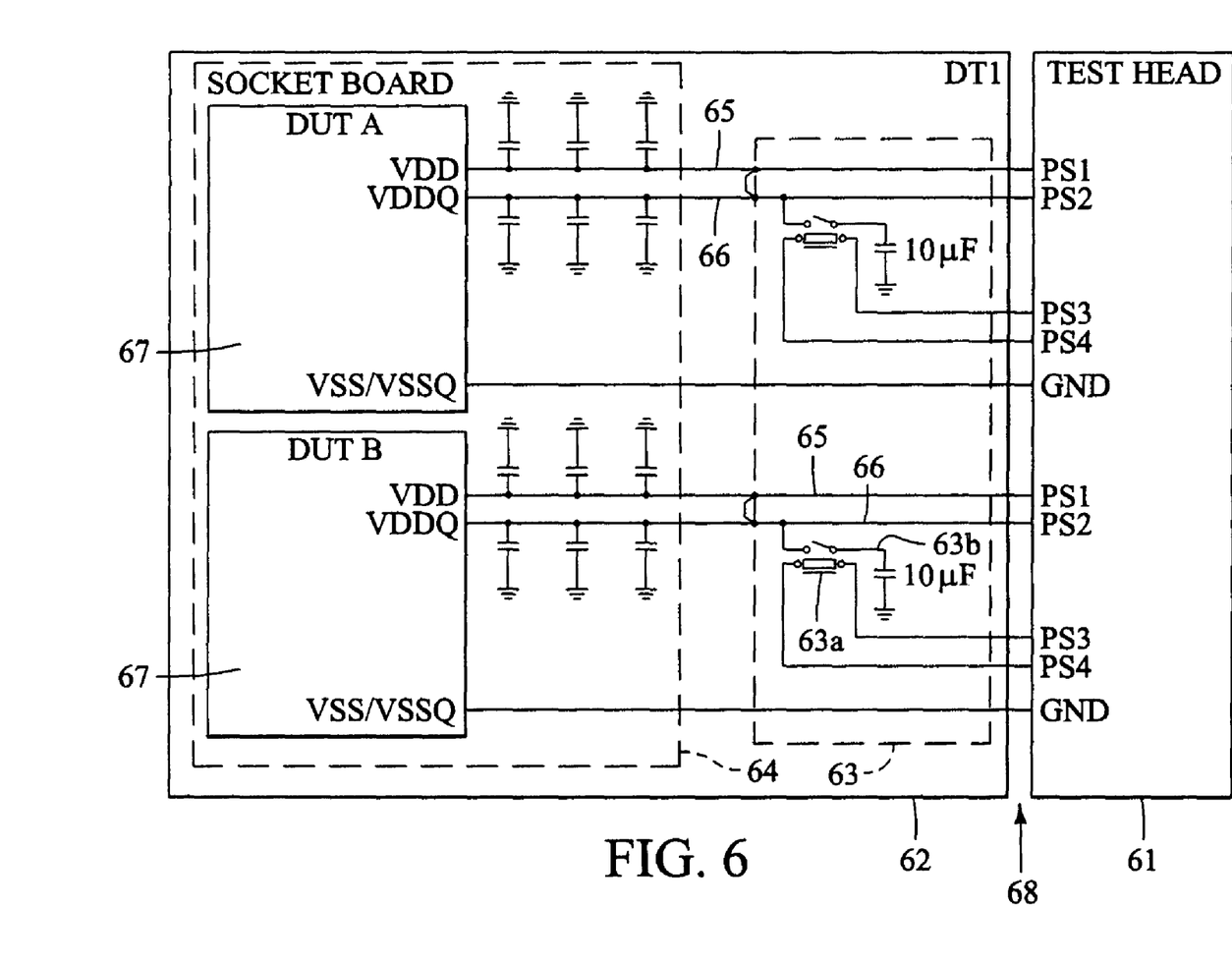
FIG. 6 is a schematic diagram of a test cell.

FIG. 6 depicts a typical testing facility in which a computer or test head 61 controls a test interface 62. Test interface 62 includes power and control circuits 63 for routing power supply 65 and isolated power supply 66 to socket board 64 and socket fixtures 67 for testing devices that have been manufactured or purchased and for which testing is desired. By the term "socket fixture" is meant any sort of bread board or socket board into which a device may be removably placed for testing. A socket board may be generic or may be specifically designed for the particular circuit in question. Typically, for testing high volumes of circuits, or for more valuable circuits, such as memory devices for use in DRAM modules, the socket boards will be application-specific and meant for use only with one particular circuit.

Typically, the wires 68 carrying inputs from the test head 61 or computer are gathered into harnesses or cables (not shown) for routing to one or more than one test interface 62. Each test interface may be designed and manufactured for a number of devices, depending on the unit volume of the device and the number that will be tested. Thus, test interface 62 may be designed with a power and control circuit 63 and a socket board 64 for a single device, such as a memory device 112, to be tested, or may be designed for more than one socket fixture to test a like number of devices, such as the two devices under test (DUT) 67 shown. Thus, test interface 62 may include power supply utilities, as shown in FIG. 6, and may also include one or more bread boards or socket boards. Power and control circuit 63 may also be designed and built with a variety of test options, such as relay 63a for switching in or out capacitor 63b or other desired components.

Figure 7:
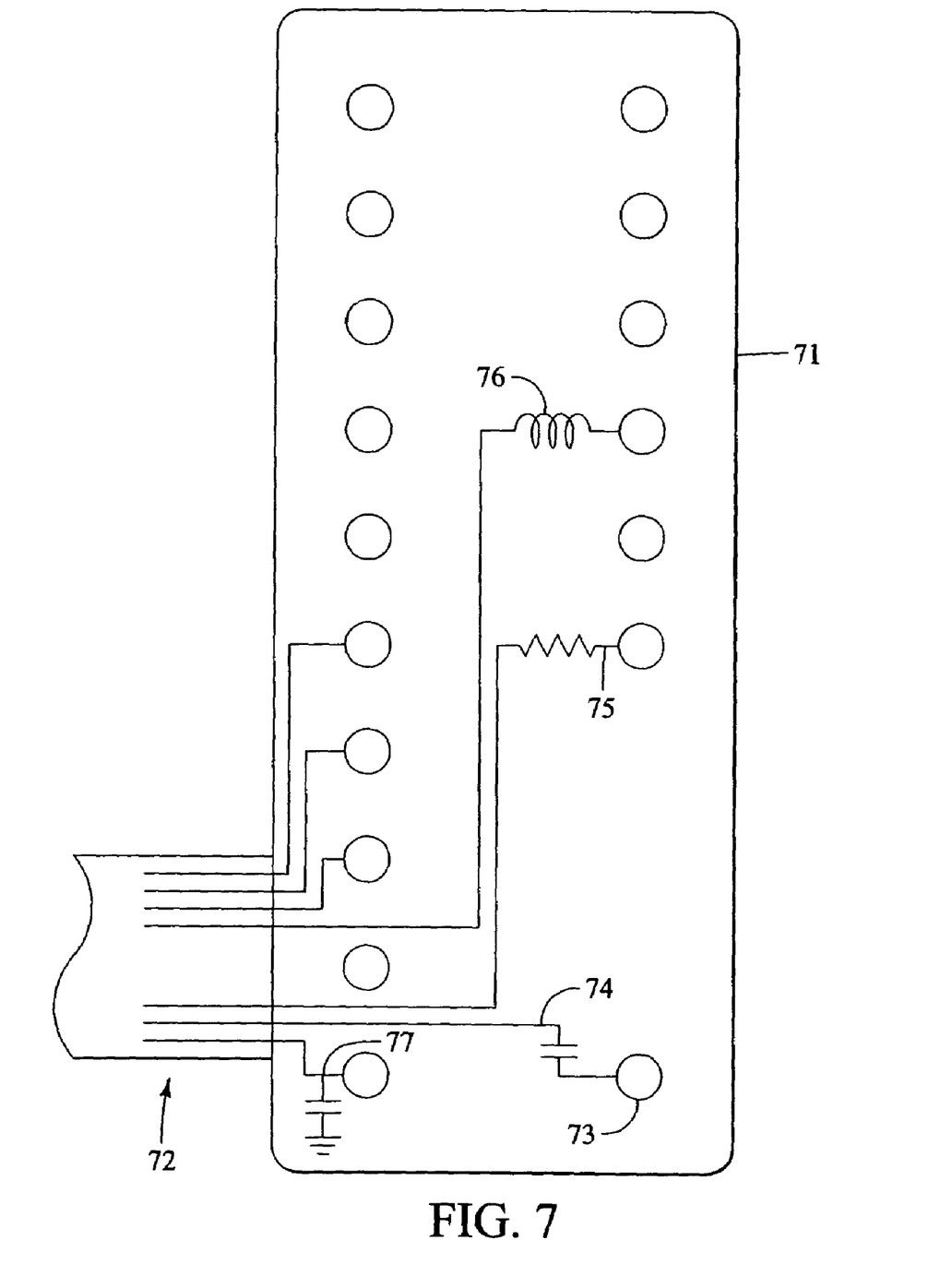
FIG. 7 is a plan view of a socket fixture for testing a circuit.

FIG. 7 depicts a bottom view of an embodiment of a socket fixture or socket board 71 in which wires 72 from test head or computer 61 and test interface 62 are routed to individual sockets 73. The socket board or socket fixture 71 is manufactured with a known capacitance 74, 77 with each socket in which a load is desired. Thus, in the examples given above, the sockets corresponding to each address pin and each command pin for a DRAM device or other circuit would have a very small capacitor wired between the socket and an incoming wire 72. The incoming wires 72 lead back to the test interface 62 and test computer 61 for some aspect of the test for which the computer, the test interface, and the socket fixture are designed. The capacitance may be between 30 and 200 nanofarads (nF). A capacitor of from about 70 about 180 nF is presently preferred for command and address lines. Capacitors at these ratings are commercially available and require capabilities of only a few volts, typically 3-5 volts. The capacitors are inexpensive and readily available from a number of commercial manufacturers. Resistors 75, inductors 76, and switching devices may also be added in series or to ground to desired sockets, between the socket and the incoming line. These components may be added by any known technique, including soldering to the incoming line, surface-mounting to the socket board, and so on.

Figure 8:
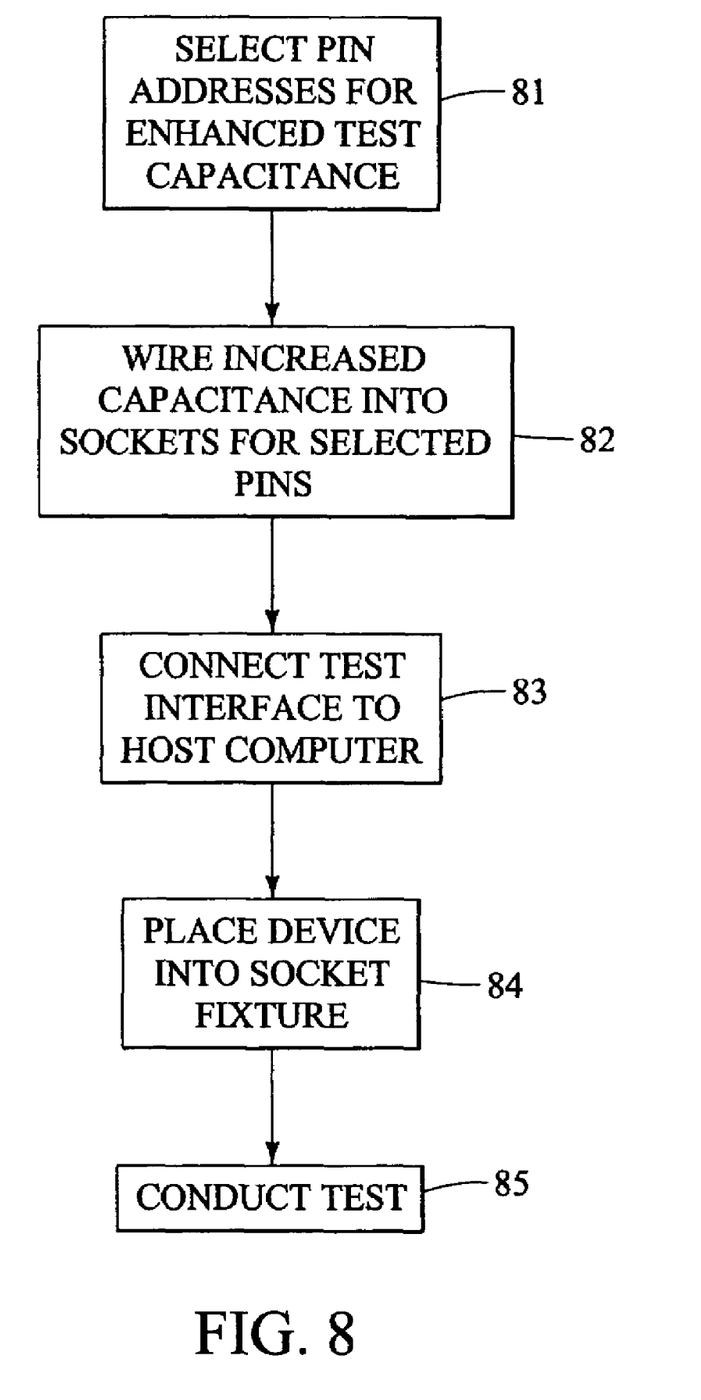
FIG. 8 is a flowchart for a method of testing an integrated circuit.

FIG. 8 is a method of using capacitance to increase testing reliability. In this method, a device to be tested is selected and the pins and addresses which may require enhanced capacitance are selected 81. The test Interface and socket fixture for these devices is then wired 82 by placing small capacitors in series with the socket for each selected pin of the device. As discussed above, the pins or addresses selected may include the address and command pins. The wired test interface and one or more socket boards with sockets is then connected 83 to a host computer and a device to be tested is placed 84 into the socket fixture. The test is then conducted 85, typically by reading and writing to the device, and noting the times for writing and retrieving data. Other performance parameters may also be used as desired.

Although only a few embodiments of the invention have been discussed, other embodiments are contemplated. It is therefore intended that the foregoing description illustrates rather than limits this invention, and that it is the following claims, including all equivalents, which define this invention. For instance, it is most convenient to mount a passive device on the socket board itself, between an individual socket and the incoming line from the test interface and ultimately from the test cell or test computer. Instead, one may mount the device directly on the test interface if the test interface is designed for the specific chip or integrated circuit. This will be more troublesome and may not be as representative of circuit performance as if the device were mounted close to the device under test, such as a DRAM memory device held in the sockets. Of course, it should be understood that a wide range of changes and modifications may be made to the embodiments described above. Accordingly, it is the intention of the applicants to protect all variations and modifications within the valid scope of the present invention.

What is claimed is:

1. A test circuit for testing an integrated circuit, the test circuit comprising:
   a computer;
   a test fixture comprising a test interface and at least one socket board with a plurality of sockets for connecting to circuits of the integrated circuit; and
   a plurality of capacitors, one of each of said capacitors connected between one of the plurality of sockets and the computer, wherein the capacitance of each capacitor is chosen in accordance with a type of circuit connected to the corresponding socket and a quantity of connections between the circuits of the integrated circuit and an electronic circuit in which the integrated circuit will be used.

2. The test circuit of claim 1, wherein the socket board is suitable for testing a dynamic random access memory device.

3. The test circuit of claim 1, wherein the capacitor has a a capacitance from about 30 nF to about 200 nF.

4. The test circuit of claim 1, wherein the type of circuit is selected from the group consisting of an address circuit, a control circuit, a clock circuit, and a data circuit.

5. A test circuit for testing an integrated circuit, the test circuit comprising:
   a computer;
   a test fixture comprising a test interface and at least one socket fixture with a plurality of sockets for connecting to circuits of the integrated circuit; and
   a plurality of capacitors, one of each of said capacitors connected between one of the plurality of sockets and the computer, wherein the capacitance of each capacitor is chosen in accordance with a type of circuit connected to the corresponding socket and a quantity of connections between the circuits of the integrated circuit and an electronic circuit in which the integrated circuit will be used, wherein the capacitance of each capacitor is from about 30 nF to about 200 nF.

6. The test circuit of claim 5, wherein the socket fixture is suitable for testing a dynamic random access memory device.

7. The test circuit of claim 5, wherein the capacitor is connected between the computer and at least one socket for an address pin of the integrated circuit.

8. The test circuit of claim 5, wherein the capacitor is connected between the computer and at least one socket for a command pin of the integrated circuit.

9. A test circuit for testing a dynamic random access memory device, the test circuit comprising:
   a computer;
   a test fixture comprising a test interface and at least one socket fixture with a plurality of sockets; and
   a plurality of capacitors, one of each of said capacitors connected in series between one of the plurality of sockets and the computer, wherein the capacitance of each capacitor is chosen in accordance with a type of circuit of the dynamic random access memory device that is connected to the corresponding socket and a quantity of connections between the circuits of the dynamic random access memory device and a dynamic random access memory module in which the dynamic random access memory device will be installed. and wherein the capacitance of each capacitor is from about 30 nF to about 200 nF.

10. The test circuit of claim 9, wherein the capacitor is connected between the computer and at least one socket for an address pin of the dynamic random access memory device.

11. The test circuit of claim 9, wherein the capacitor is connected between the computer and at least one socket for a command pin of the dynamic random access memory device.

12. A method of testing an integrated circuit before installation in another circuit, the method comprising:
   providing a test computer and a test interface, the test interface including at least one bread board with a plurality of sockets for receiving pins from an integrated circuit;
   providing a plurality of capacitors of between about 30 nF to about 200 nF;
   choosing the capacitance of each capacitor in accordance with a type of circuits of the integrated circuit and a quantity of connections between the circuits of the integrated circuit and an electronic circuit in which the integrated circuit will be installed.
   connecting one of each of said capacitors in series between one of the plurality of sockets and the computer; and
   testing the integrated circuit.

13. The method of claim 12, wherein the integrated circuit is a dynamic random access memory device.

14. The method of claim 12, wherein the integrated circuit is a dynamic random access memory device and the capacitance is connected between the computer and at least one socket for an address pin.

15. The method of claim 12, wherein the integrated circuit is a dynamic random access memory device and the capacitance is connected between the computer and at least one socket for a command pin.

16. A method of testing an integrated circuit, the method comprising:
   providing a test computer and a test interface further including at least one socket board with a plurality of sockets for receiving pins from an integrated circuit;
   connecting a plurality of passive components, each of said passive components in series between one of the plurality of sockets and the computer, wherein a capacitance of each of said passive components is chosen in accordance with a type of circuits connected to the pins and a quantity of connections between the circuits and an electronic circuit in which the integrated circuit will be installed; and
   testing the integrated circuit.

17. The method of claim 16, wherein the integrated circuit is a dynamic random access memory device.

18. The method of claim 16, wherein the integrated circuit is a dynamic random access memory device and the passive component is connected between the computer and at least one socket for an address pin.

19. The method of claim 16, wherein the passive component is selected from the group consisting of a capacitor, an inductor, and a resistor.

20. The method of claim 16, wherein the passive component is a capacitor of about 70 to about 180 nF.

* * * * *